(12) United States Patent
Mitsuiki

(10) Patent No.: US 6,372,602 B1
(45) Date of Patent: Apr. 16, 2002

(54) METHOD OF FORMING A SHALLOW TRENCH ISOLATION STRUCTURE IN A SEMICONDUCTOR DEVICE

(75) Inventor: Akira Mitsuiki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/571,733

(22) Filed: May 15, 2000

(30) Foreign Application Priority Data

May 14, 1999 (JP) ............................................ 11-133562

(51) Int. Cl.[7] .............................................. H01L 21/76
(52) U.S. Cl. ....................... 438/424; 438/296; 438/426; 438/431; 438/437; 438/756; 438/425
(58) Field of Search ................................ 438/424, 425, 438/426, 296, 435, 437, 431, 439, 756

(56) References Cited

U.S. PATENT DOCUMENTS

| 5,712,185 A | 1/1998 | Tsai et al. | |
|---|---|---|---|
| 5,940,716 A | 8/1999 | Jin et al. | |
| 5,963,819 A | * 10/1999 | Lan | 438/424 |
| 6,080,637 A | * 6/2000 | Huang et al. | 438/424 |
| 6,093,621 A | * 7/2000 | Tseng | 438/424 |
| 6,140,208 A | * 10/2000 | Agahi et al. | 438/437 |

FOREIGN PATENT DOCUMENTS

| EP | 0936665 A1 | 8/1999 |
|---|---|---|
| GB | 2326282 A | 12/1998 |
| JP | 9326432 | 12/1997 |
| WO | WO 9829905 | 7/1998 |

* cited by examiner

Primary Examiner—Matthew Smith
Assistant Examiner—Igwe W. Anya
(74) Attorney, Agent, or Firm—Young & Thompson

(57) ABSTRACT

The present invention provides a method of forming a shallow trench isolation structure in a substrate. The method comprises the steps of: forming an isolation silicon oxide film which comprises an upper portion extending over a silicon oxide film over a silicon nitride film and a lower portion extending in a trench in a silicon substrate; and carrying out an isotropic etching to said upper portion of said isolation silicon oxide film and said silicon oxide film, thereby forming an isolation trench structure without divots in said trench in said silicon substrate.

3 Claims, 17 Drawing Sheets

METHOD OF FORMING A SHALLOW TRENCH ISOLATION STRUCTURE IN A SEMICONDUCTOR DEVICE

BACKGROUND OF THE INVENTION

The present invention relates to a method of forming a semiconductor device, and more particularly to a method of forming a shallow trench isolation with an isolation oxide film free of any divot and any void as well as a method of preventing formation of any divot and any void in the isolation oxide film of the shallow trench isolation.

The shallow trench isolation structure is used as an isolation structure in an advanced ultra large scale integrated circuit device for further improvements in scaling down and isolation property. This shallow trench isolation structure is superior in isolation characteristics as compared to a local oxidation of silicon structure. This shallow trench isolation structure is also smaller in occupied area than the local oxidation of silicon structure. Accordingly, the shallow trench isolation structure is more suitable for further increase in high integration of the integrated circuit. The number of the semiconductor device having the shallow trench isolation structure has been on the increase.

The conventional method of forming the shallow trench isolation structure will be described. FIGS. 1A through 1E are fragmentary cross sectional elevation views illustrative of semiconductor devices with shallow trench isolation structures in sequential steps involved in the conventional method of forming the same.

With reference to FIG. 1A, a thermal oxide film 4 as a pad oxide film is formed on a silicon substrate 2. A silicon nitride film 6 as a chemical mechanical polishing stopper is deposited on the thermal oxide film 4. A resist film is applied on the silicon nitride film 6. The resist film is then patterned by a lithograph technique to form a resist pattern 8.

With reference to FIG. 1B, the resist pattern 8 is used to carry out an isotropic etching to the silicon nitride film 6, the thermal oxide film 4 and the silicon substrate 2, whereby a trench is formed which penetrates the silicon nitride film 6 and the thermal oxide film 4 and reaches a predetermined depth from the surface of the silicon substrate 2.

With reference to FIG. 1C, the resist pattern 8 is removed. A plasma oxide film 10 is entirely deposited by a plasma enhanced chemical vapor deposition method over the silicon nitride film 6 and within the trench, whereby the trench is filled with the plasma oxide film 10. The plasma oxide film 10 is polished by use of the silicon nitride film 6 as a polishing stopper, whereby the plasma oxide film 10 remains only within the trench.

With reference to FIG. 1D, the silicon nitride film 6 is removed by a wet etching.

With reference to FIG. 1E, the pad oxide film 4 is further removed by a wet etching, whereby the isolation oxide film 10 projects upwardly from the surface of the silicon substrate 2.

The shallow trench isolation is superior in device characteristic but causes a problem in the fabrication processes. Divots are formed in the isolation oxide film. FIG. 2 is a fragmentary cross sectional elevation view illustrative of an isolation oxide film with divots. Namely, the silicon nitride film 6 as the chemical mechanical polishing stopper is removed, whereby the isolation oxide film 10 projects upwardly from the surface of the pad oxide film 4. This pad oxide film 4 is then removed by a wet etching. This wet etching is an isotropic etching. The pad oxide film 4 and the isolation oxide film 10 are also silicon oxide films. The wet etching is effective to the silicon oxide films, or not only the pad oxide film 4 but also the isolation oxide film 10. Namely, as the pad oxide film 4 is removed by he wet etching, the isolation oxide film 10 is also isotropically etched by the wet etching in isotropic directions as shown in arrow marks "a", "b", and "c" thereby forming divots 22 in FIG. 2. After the removal of the pad oxide film 4, further wet etching processes for removing the silicon oxide films are carried out, whereby the divots are further enlarged.

A mechanism of forming the divots 22 will be described in detail. As described above, the wet etching is carried out to the pad oxide film 4. Since the wet etching is an isotropic etching. The etching direction is isotropic and includes the three directions "a", "b" and "c". The direction "a" is a downward direction to etch the isolation oxide film 10. The direction "b" is a lateral direction to etch the isolation oxide film 10. The isolation oxide film 10 is etched in the two directions "a" and "b" before the pad oxide film 4 is completely etched. After the pad oxide film 4 has been completely etched, the isolation oxide film 10 is etched not only in the directions "a" and "b" but also in the direction "c". The etching in the direction "c" forms the divots 22. Since the pad oxide film 4 is very thin, for example, has a thickness in the range of 5–30 nanometers, the pad oxide film 4 is removed in a very short time, whereby the surface of the silicon substrate 2 is shown and the etching to the isolation oxide film 10 in the direction "c" is started to form the divots 22.

After the wet etching process has been carried out and the divots 22 have been formed, a photo-lithography process is carried out. The divots 22 form a difference in level or steps which provides an influence of halation to the photo-lithography process. A dry etching is carried out to a film over the divots 22 by use of the resist mask prepared by the photo-lithography process, provided that the film has a variation in thickness due to the divots 22. This makes it difficult to ensure an accurate selectively and control to the shape.

The above conventional method causes a further problem as follows. As described above, the trench groove is filled by the CVD oxide film deposited by the plasma enhanced chemical vapor deposition method to form the isolation oxide fi within the trench. FIG. 3 is a fragmentary cross sectional elevation view illustrative of a trench isolation with a void formed in a trench in a semiconductor substrate in accordance with the conventional method. The isolation oxide film within the trench may have a void or a cavity 20. If the trench has a high aspect ratio of a depth to a width of the trench, a lateral direction deposition rate could not be ignored in relation to a vertical direction deposition rate, whereby the vertical direction deposition of the isolation oxide film by the plasma enhance chemical vapor deposition method is limited by the lateral direction deposition thereof. Namely, the deposition in the lateral direction could not be ignored, whereby the deposition rate in the shallow portion of the trench is made faster than the deposition rate in the deep portion of the trench. This makes it possible that the trench is made blockage in the shallow portion thereof, whereby the silicon oxide is no longer supplied to the deeper portion of the trench, whereby no longer deposition of the silicon oxide appears in the deeper portion of the trench. As a result, the void or cavity 20 is formed in the isolation oxide film in the trench. If the void or cavity 20 is formed in the isolation oxide film within the trench, a deep groove or depressed portion is formed in the isolation oxide film during the chemical and mechanical polishing method. This deep groove or depressed portion causes the same problem as described above. Namely, the deep groove or depressed portion form a difference in level or steps which provides an influence of halation to the photo-lithography process. A dry etching is carried out to a film over the deep groove or depressed portion by use of the resist mask prepared by the photo-lithography process, provided that the film has a variation in thickness due to the deep groove or depressed portion. This makes it difficult to ensure an accurate selectively and control to the shape.

In the above circumstances, it had been required to develop a novel method of forming a shallow trench isolation free from the above problem.

SUMMARY OF THE INVENTION

Accordingly, it is an object of the present invention to provide a novel method of forming a shallow trench isolation free from the above problems.

It is a further object of the present invention to provide a novel method of forming a shallow trench isolation to prevent formation of divots in an isolation oxide film for allowing a photo-lithography process and a subsequent dry etching process.

It is a still further object of the present invention to provide a novel method of forming a shallow trench isolation to prevent formation of void or cavity in an isolation oxide film for allowing a photo-lithography process and a subsequent dry etching process.

The present invention provides a method of forming a shallow trench isolation structure in a substrate. The method comprises the steps of: forming an isolation silicon oxide film which comprises an upper portion extending over a silicon oxide film over a silicon nitride film and a lower portion extending in a trench in a silicon substrate; and carrying out an isotropic etching to said upper portion of said isolation silicon oxide film and said silicon oxide film, thereby forming an isolation trench structure without divots in said trench in said silicon substrate.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides a method of forming a shallow trench isolation structure in a substrate. The method comprises the steps of: forming an isolation silicon oxide film which comprises an upper portion extending in lateral directions over a silicon oxide film over a silicon nitride film and a lower portion extending in a trench in a silicon substrate; and carrying out an isotropic etching to the upper portion of the isolation silicon oxide film and the silicon oxide film, thereby forming an isolation trench structure without divots in the trench in the silicon substrate.

It is preferable that the first step comprises the steps of: carrying out an isotropic etching to the silicon nitride film in lateral directions by use of a resist pattern as used to form a trench in the silicon substrate and extending over the silicon nitride film ; removing the resist pattern depositing a silicon oxide film ; polishing the silicon oxide film so that the silicon oxide film is planarized to the silicon nitride film; removing the silicon nitride film, thereby forming the isolation silicon oxide film.

It is also preferable that the first step comprises the steps of: forming a trench by use of a resist pattern on the silicon nitride film; removing the resist pattern; carrying out an isotropic etching to the silicon nitride film in lateral directions b use of the silicon nitride film as a mask; depositing a silicon oxide film; polishing the silicon oxide film so that the silicon oxide film is planarized to the silicon nitride film; removing the silicon nitride film, thereby forming the isolation silicon oxide film.

It is also preferable that the first step comprises the steps of: forming a trench by use of a resist pattern on the silicon nitride film; removing the resist pattern; carrying out a sputter etching to the silicon nitride film to form sloped portions of the silicon nitride film; depositing a silicon oxide film; polishing the silicon oxide film so that the silicon oxide film is planarized to the silicon nitride film; and removing the silicon nitride film, thereby forming the isolation silicon oxide film.

PREFERRED EMBODIMENT

Figure 1A:
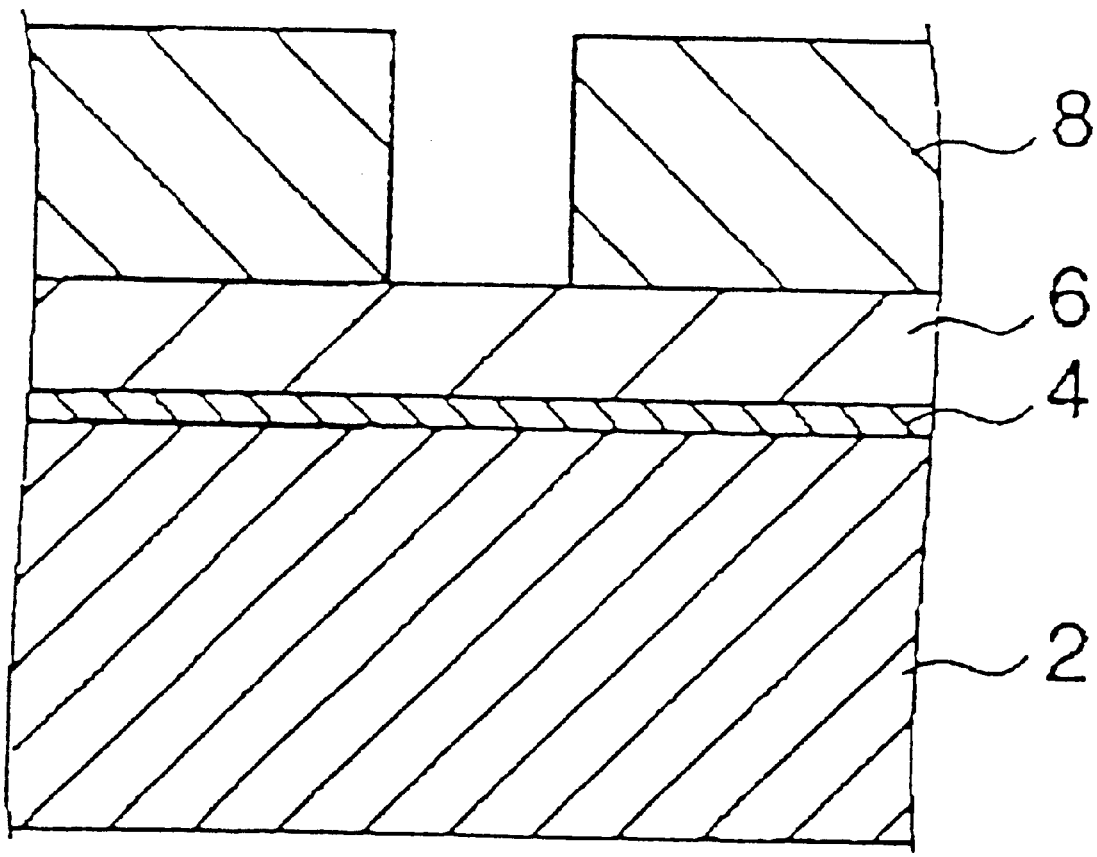
FIGS. 1A through 1E are fragmentary cross sectional elevation views illustrative of semiconductor devices with shallow trench isolation structures in sequential steps involved in the conventional method of forming the same.
Figure 1B:
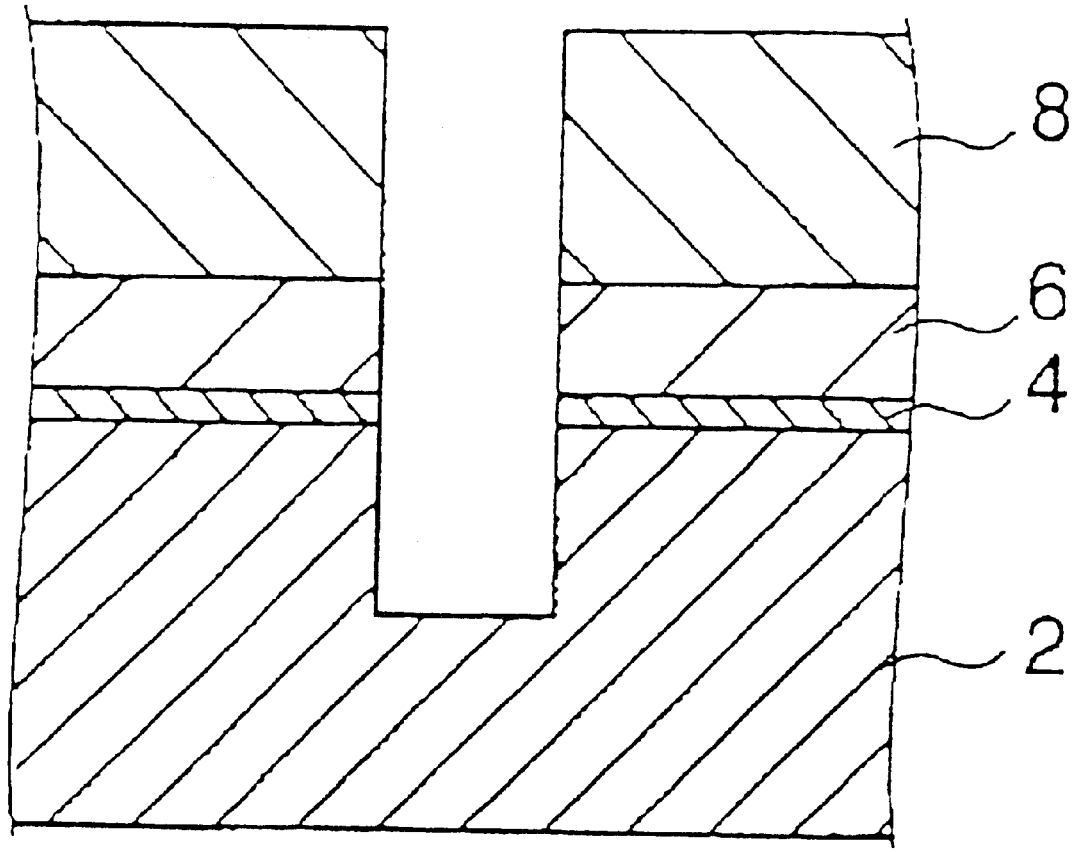
Figure 1C:
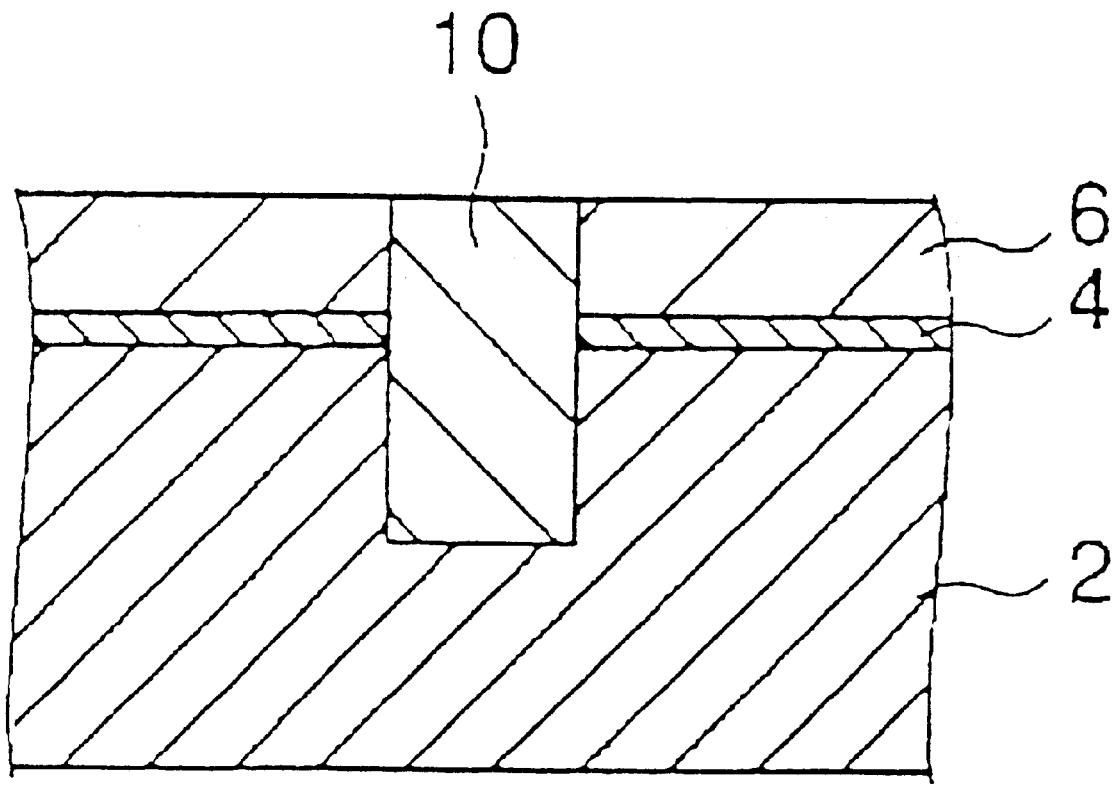
Figure 1D:
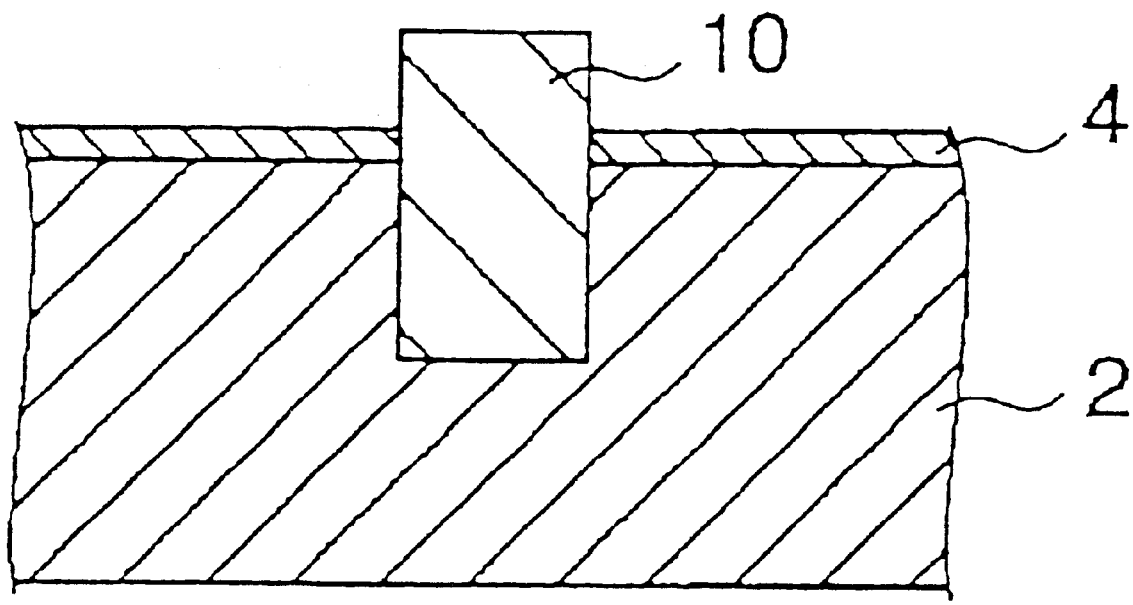
Figure 1E:
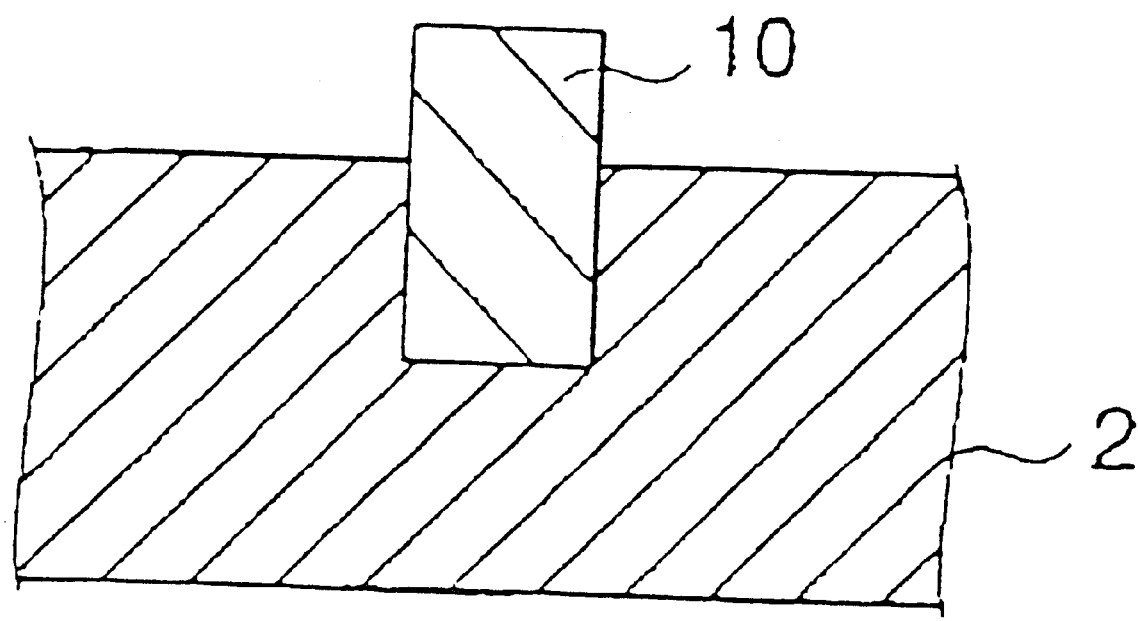
Figure 2:
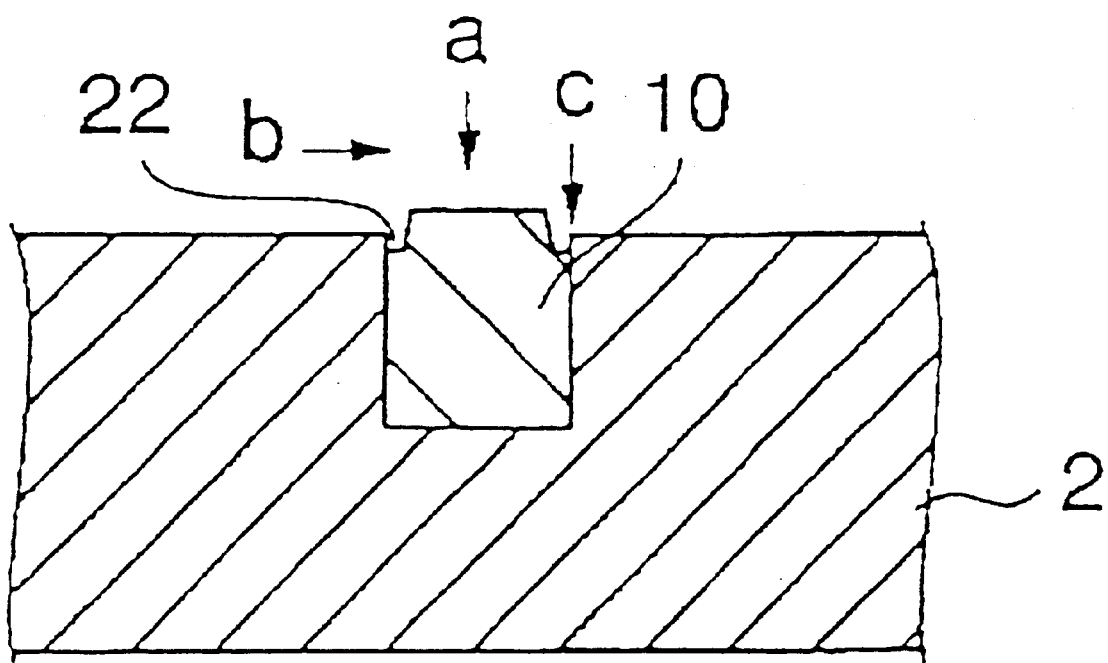
FIG. 2 is a fragmentary cross sectional elevation view illustrative of an isolation oxide film with divots formed in the conventional method of forming the shallow trench isolation.
Figure 3:
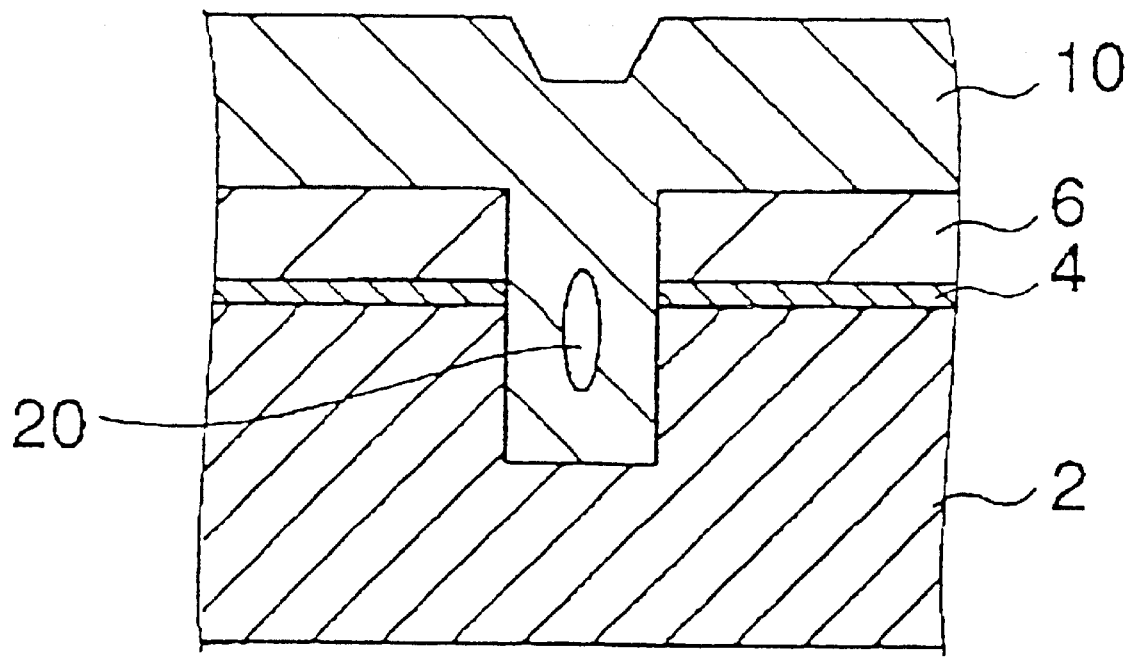
FIG. 3 is a fragmentary cross sectional elevation view illustrative of a trench isolation with a void formed in a trench in a semiconductor substrate in accordance with the conventional method.
Figure 4:
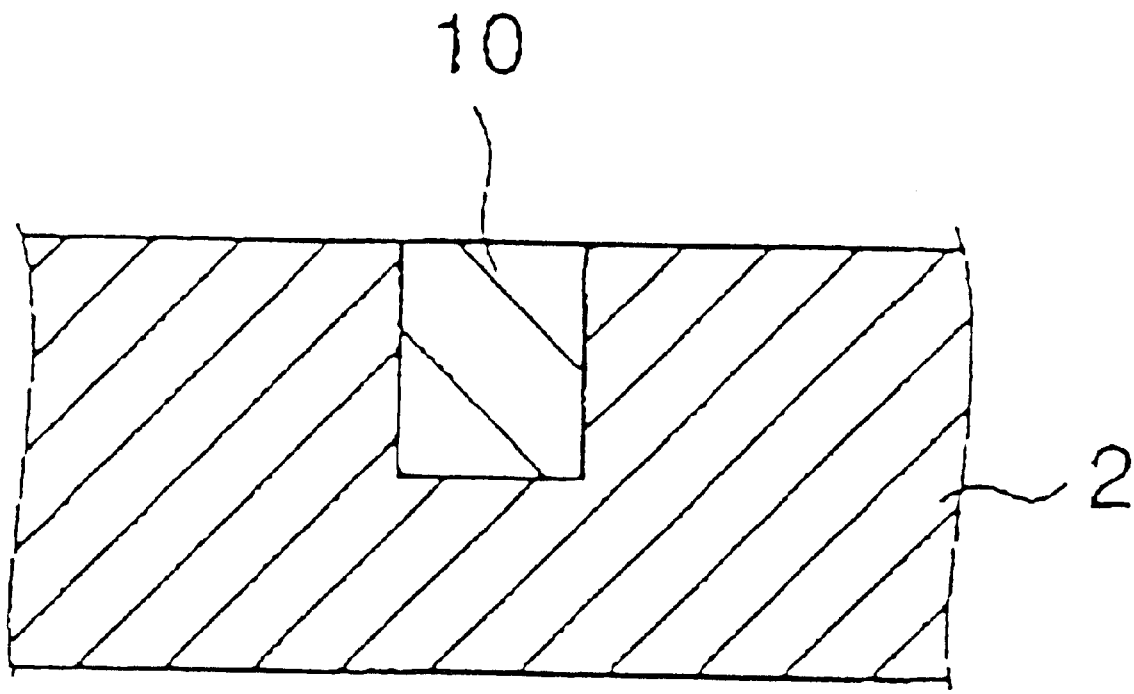
FIG. 4 is a fragmentary cross sectional elevation view illustrative of a shallow trench isolation in a shallow trench in a semiconductor substrate, wherein a shallow trench isolation is free of any divots, voids or cavities formed in a novel method of forming the shallow trench isolation structure in accordance with the present invention.

A first embodiment according to the present invention will be described in detail with reference to the drawings. FIG. 4 is a fragmentary cross sectional elevation view illustrative of a shallow trench isolation in a shallow trench in a semiconductor substrate, wherein a shallow trench isolation is free of any divots, voids or cavities formed in a novel method of forming the shallow trench isolation structure in accordance with the present invention. A silicon substrate 2 has a shallow trench which has a width in the range of 0.1–1.0 micrometer and a depth in the range of 200–600 nanometers. A trench isolation oxide film 10 is filled within the shallow trench of the silicon substrate 2. The top of the trench isolation oxide film 10 and the top surface of the silicon substrate 2 are exactly planarized. The trench isolation oxide film 10 free of any divots and voids or cavities.

A novel method of forming a shallow trench isolation structure in a semiconductor substrate will be described, FIGS. 5A through 5G are fragmentary cross sectional elevation views illustrative of shallow trench isolation structures in sequential steps involved in a novel method of forming the same in a first embodiment in accordance with the present invention.

Figure 5A:
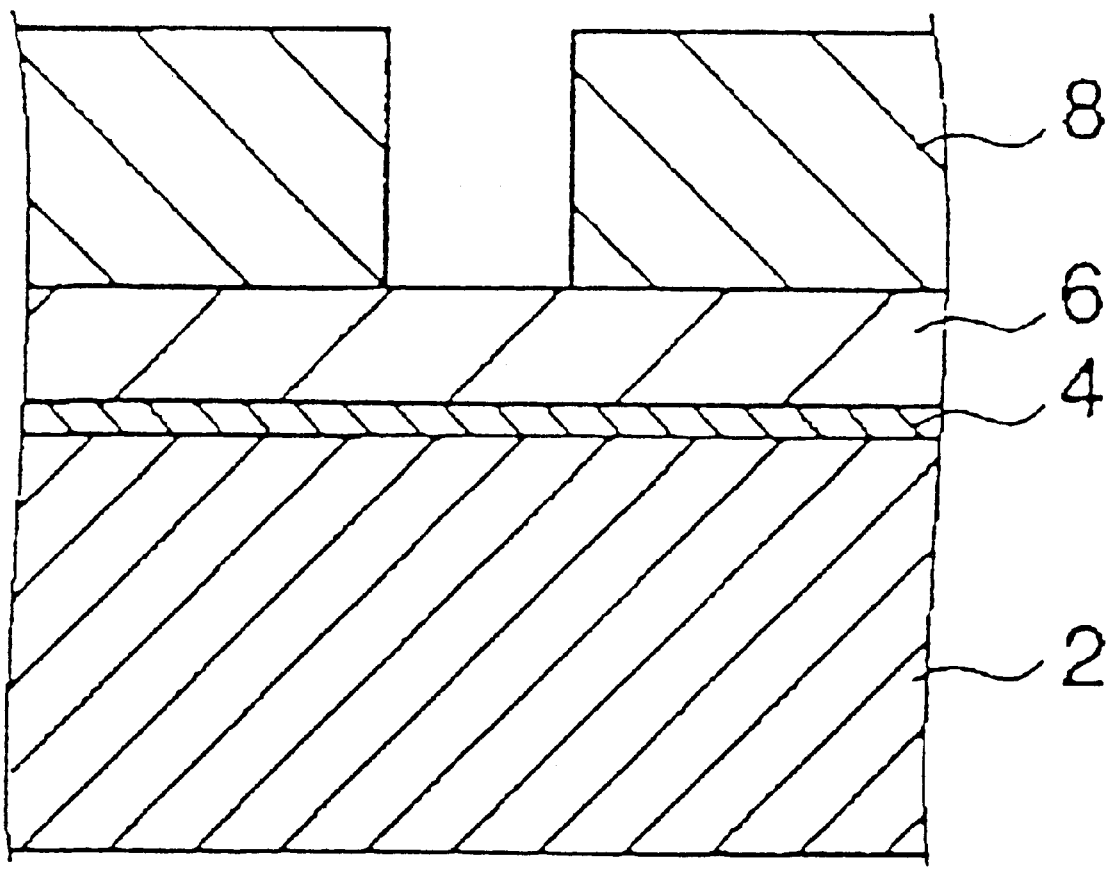
FIGS. 5A through 5G are fragmentary cross sectional elevation views illustrative of shallow trench isolation structures in sequential steps involved in a novel method of forming the same in a first embodiment in accordance with the present invention.

With reference to FIG. 5A, a thermal oxide film 4 as a pad oxide film having a thickness in the range of 5–30 nanometers is formed on a silicon substrate 2. A silicon nitride film 6 as a chemical mechanical polishing stopper having a thickness in the range of 100–300 nanometers is deposited on the thermal oxide film 4. A resist film is applied on the silicon nitride film 6. The resist film is then patterned by a lithograph technique to form a resist pattern 8.

Figure 5B:
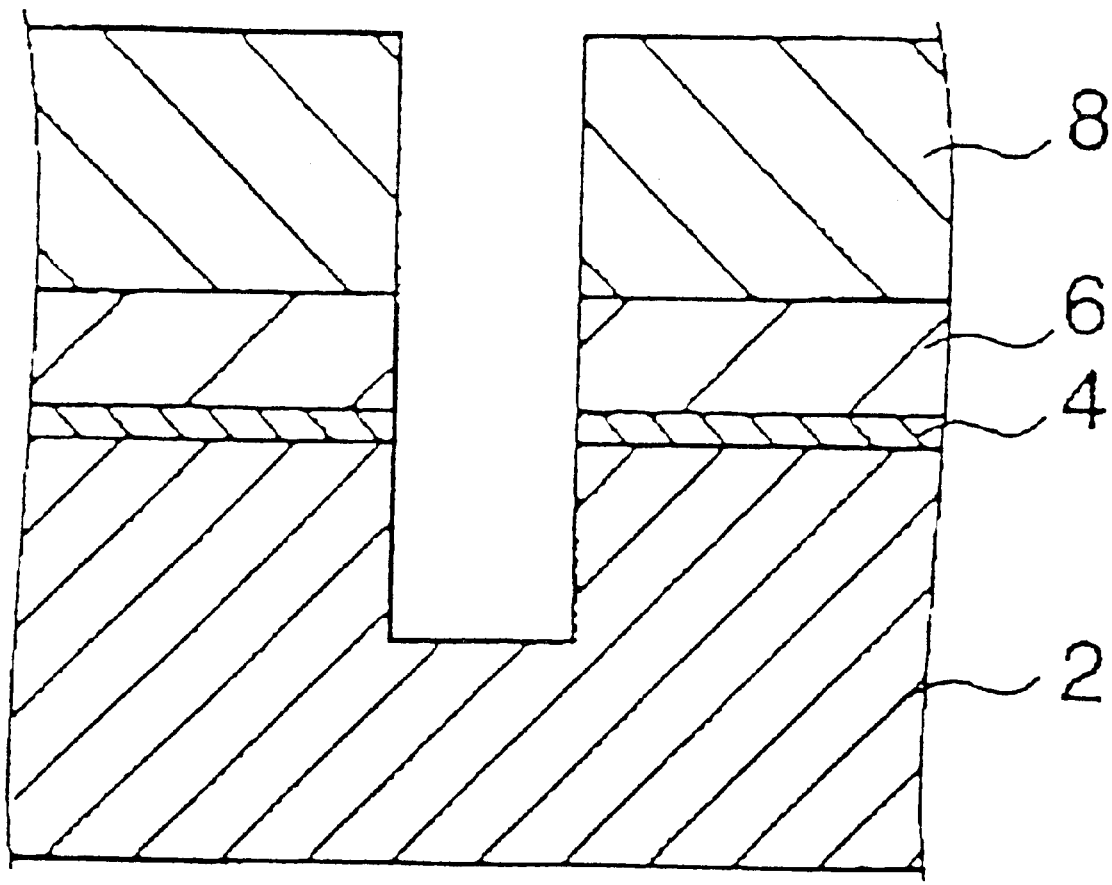

With reference to FIG. 5B, the resist pattern 8 is used to carry out an isotropic etching to the silicon nitride film 6, the thermal oxide film 4 and the silicon substrate 2, whereby a trench is formed which penetrates the silicon nitride film 6 and the thermal oxide film 4 and reaches a predetermined depth in the range of 200–600 nanometers from the surface of the silicon substrate 2.

Figure 5C:
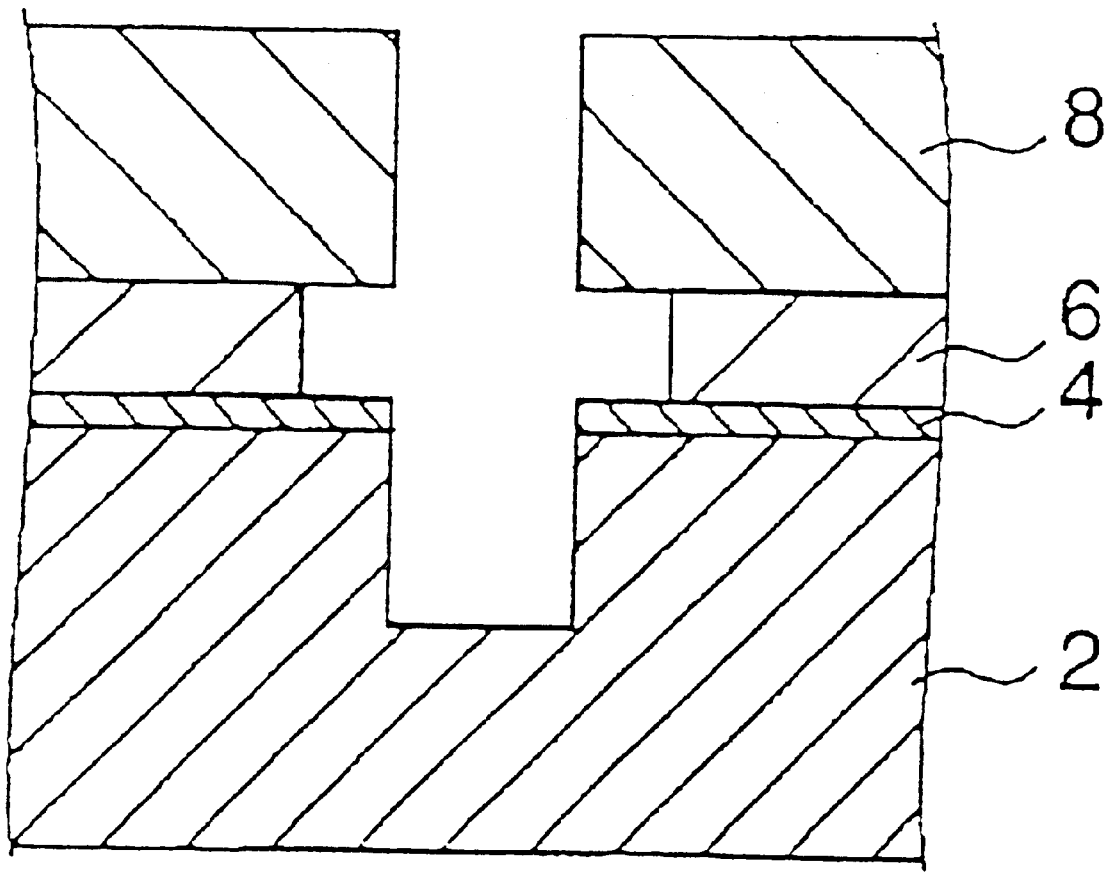

With reference to FIG. 5C, an isotropic dry etching to the silicon oxide film 6 is carried out by having the resist pattern 8 remain on the silicon nitride film 6, whereby the silicon nitride film 6 under the resist pattern 8 is etched in a lateral direction, so that the etched silicon nitride film 6 retreats in opposite lateral directions by an amount in the range of 0.05–0.3 micrometers from the side walls of the trench of the silicon substrate 2 and the side walls of the resist pattern 8. It is preferable that this amount of retreat of the etched silicon nitride film 6 from the side walls of the trench of the silicon substrate 2 and the side walls of the resist pattern 8 is greater than the thickness of the silicon nitride film 6.

Figure 5D:
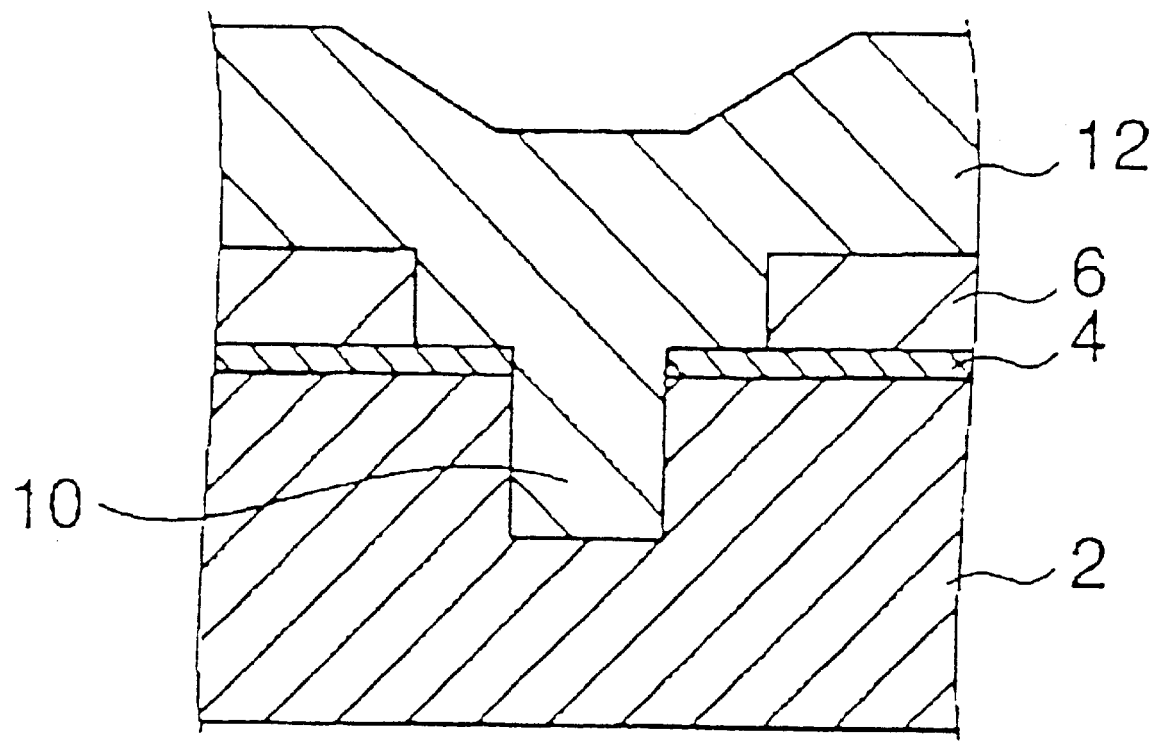

With reference to FIG. 5D, the resist pattern 8 is removed. A plasma oxide film 12 is entirely deposited by a plasma enhanced chemical vapor deposition method over the silicon nitride film 6 and on the pad silicon oxide film 4 as well as within the trench of the silicon substrate 2, whereby the trench is filled with an isolation oxide film 10 as a part of the plasma oxide film 12 within the trench of the silicon substrate 2. The plasma oxide film 12 has a thickness in the range of 200–800 micrometers.

Figure 5E:
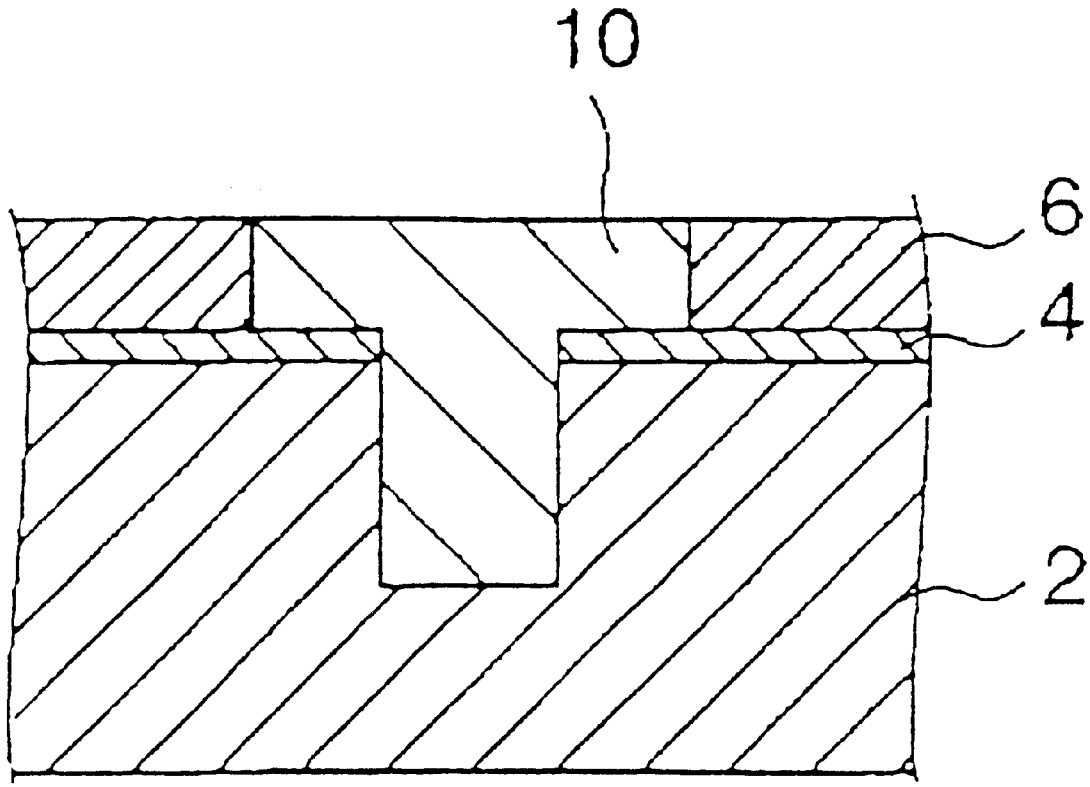

With reference to FIG. 5E, the plasma oxide film 12 is polished by a chemical mechanical polish with use of the silicon nitride film 6 as a polishing stopper, whereby the plasma oxide film 10 remains only within the trench of the silicon substrate 2.

Figure 5F:
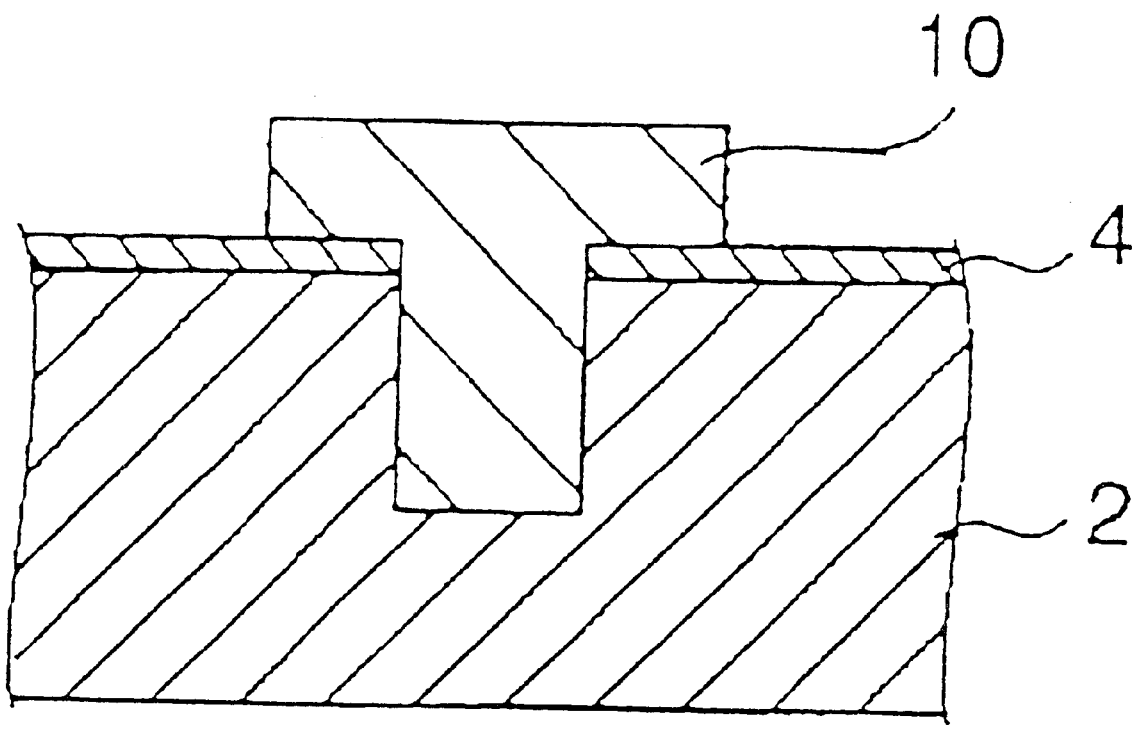

With reference to FIG. 5F, the silicon nitride film 6 is removed by a wet etching.

Figure 5G:
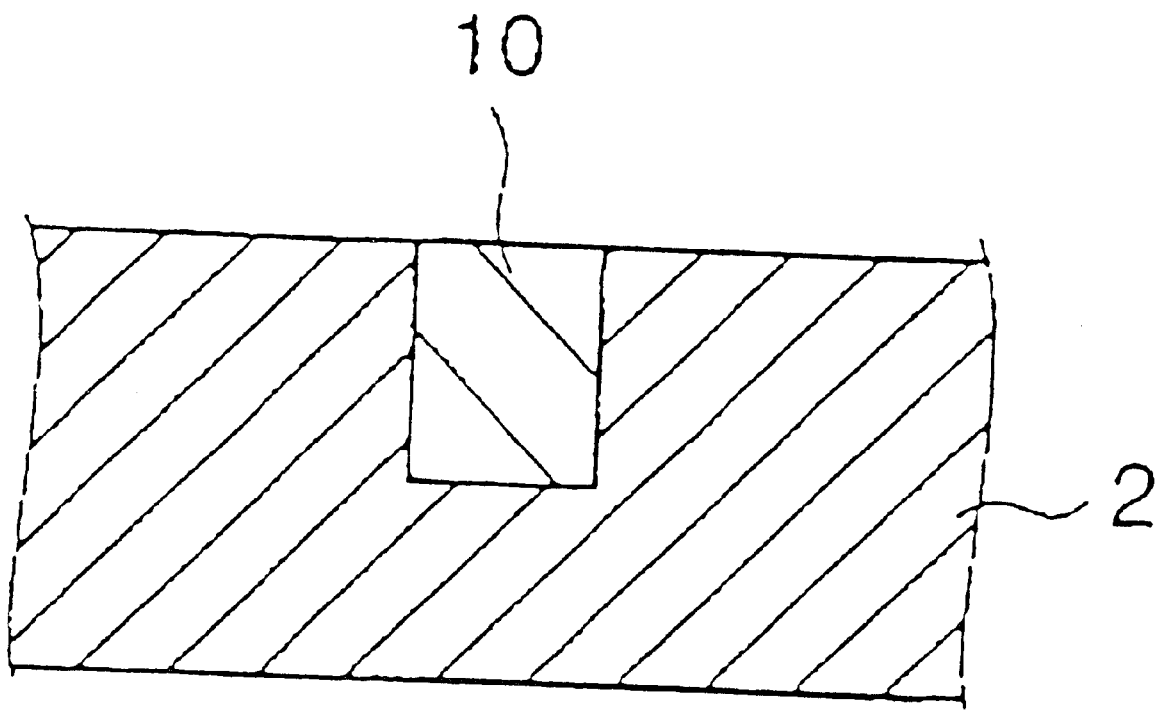

With reference to FIG. 5G, the pad oxide film 4 and the upper portion of the isolation oxide film 10 over the trench of the silicon substrate 2 are further removed by a wet etching.

The top of the trench isolation oxide film 10 and the top surface of the silicon substrate 2 are exactly planarized. The trench isolation oxide film 10 is free of any divots and voids or cavities.

As described above, as shown in FIG. 5F, the trench isolation oxide film 10 comprises a lower isolation portion in the trench of the silicon substrate 2, and an upper portion which extends laterally over the pad oxide film 4. This upper portion which extends laterally over the pad oxide film 4 prevents formation of divots during the isotropic etching to remove the pad oxide film 4, whereby the planarized isolation structure can be obtained.

As described above, as shown in FIG. 5C, the silicon nitride film 6 is etched in the opposite lateral directions. As shown in FIG. 5D, the plasma oxide film 12 is deposited by the plasma enhanced chemical vapor deposition method wherein the silicon nitride film 6 is retreated in laterally opposite directions from the side walls of the trench of the silicon substrate 2. This means that the trench has a wider upper portion which prevents any blockage in the upper portion due to lateral deposition of the plasma silicon oxide, whereby the problem with the formation of voids and cavities is avoided.

As a first modification to the above, the resist pattern 8 may be replaced by silicon oxide film patterns, wherein the silicon oxide film patterns are formed over the silicon nitride film 6 for subsequent isotropic dry etching to the silicon nitride film in the laterally opposite directions. In this case, the used silicon oxide film over the silicon nitride film is removed by the chemical and mechanical polishing.

As a second modification to the above present invention, a wet etching may be used in place of the isotropic dry etching to the silicon nitride film in the laterally opposite directions, so that the silicon nitride film is retreated from the side walls of the trench of the silicon substrate 2.

As a third modification to the above present invention, in place of the plasma oxide film 12, other oxide films as grown in low pressure or atmospheric pressure growth methods may be available for forming the isolation oxide film 10.

As a fourth modification to the above present invention, in place of the wet etching, a dry etching is available for removing the silicon nitride film.

As a fifth modification to the above present invention, in place of the chemical mechanical polishing, the wet etching may be available for partially removing the plasma oxide film 12 to have the isolation oxide film remain in the trench.

As a sixth modification to the above present invention, in place of the isotropic etching by use of the resist pattern 8, the isotropic etching is carried out without using the resist pattern 8 after the resist pattern 8 was removed, provided that the thickness of the silicon nitride film 6 is required to be sufficient for allowing the silicon nitride film 6 serves as a chemical mechanical polishing stopper.

Figure 6A:
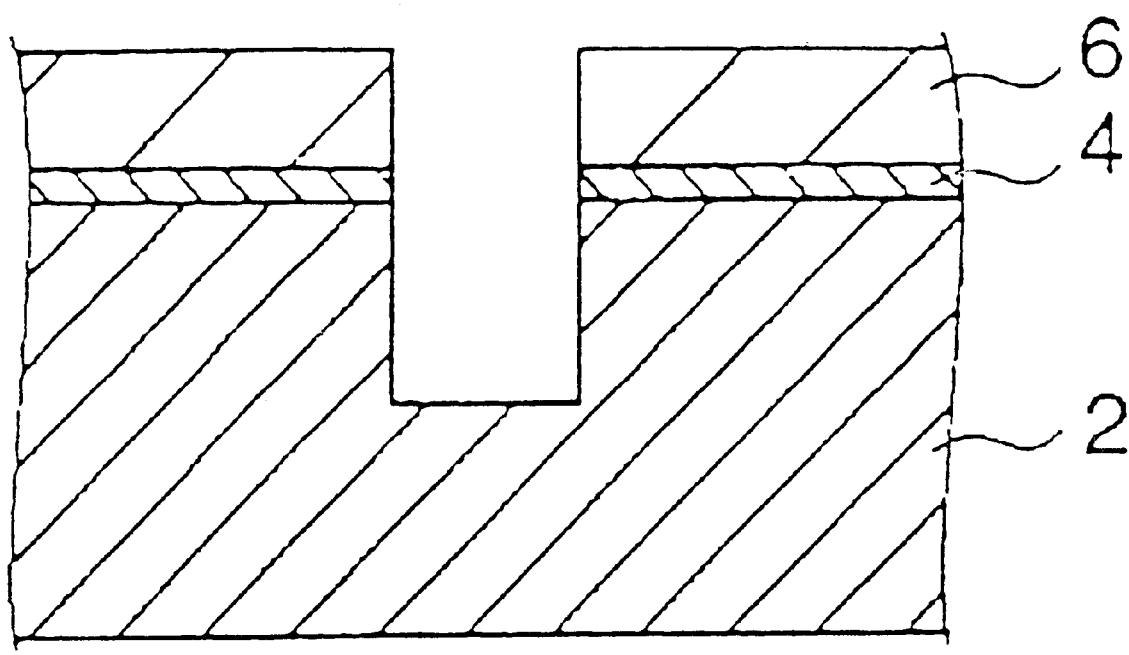
FIGS. 6A and 6B are fragmentary cross sectional elevation views illustrative of trenches formed in the silicon substrate in two steps involved in the sequential steps involved in the modified novel method in accordance with the present invention.
Figure 6B:
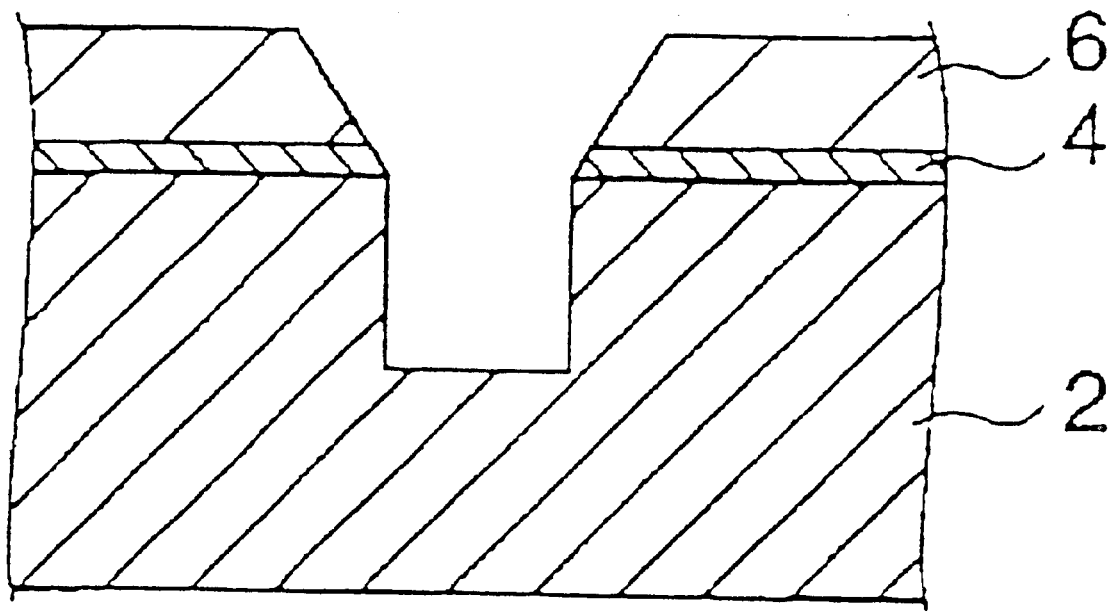

Further, an argon sputter re etching method is available. After the trench is formed by the etching process, the resist pattern 8 is once removed before the argon sputter etching is carried out to the silicon nitride film 6, so that the silicon nitride film 6 has sloped portions. FIGS. 6A and 6B are fragmentary cross-sectional elevation views illustrative of trenches formed in the silicon substrate in two steps involved in the sequential steps involved in the modified novel method in accordance with the present invention.

In this method, the processes as shown in FIGS. 5A through 5B are carried out. With reference to FIG. 6A, the resist pattern 8 is removed. With reference to FIG. 6B, the argon sputter re etching method is carried out to form sloped portions of the silicon nitride film 6, whereby the trench opening portion is widen and slope-shaped, thereby to prevent any blockage in the upper portion due to a lateral deposition of the plasma silicon oxide, whereby no problem with the formation of void and cavity is raised.

As a further modification, the resist pattern is used to form a trench in the silicon nitride film. The resist pattern is removed. The silicon nitride film is used as a mask to form a trench, whereby the silicon nitride film is made have sloped portions, whereby the trench opening portion is widen and slope-shaped, thereby to prevent any blockage in the upper portion due to an lateral deposition of the plasma silicon oxide, whereby no problem with the formation of void and cavity is raised.

As a further modification, in place of argon, neon or xenon is available as a sputter gas.

Whereas modifications of the present invention will be apparent to a person having ordinary skill in the art, to which the invention pertains, it is to be understood that embodiments as shown and described by way of illustrations are by no means intended to be considered in a limiting sense, Accordingly, it is to be intended to cover by claims all modifications which fall within the spirit and scope of the present invention.

What is claimed is:

1. A method of forming a trench structure in a substrate, said method comprising the steps of:

(a) forming a silicon substrate having an oxide film over said substrate and a nitride film over said oxide film;

(b) forming a trench groove with vertical side walls which extend through said nitride film and said oxide film into said substrate;

(c) exposing all surfaces of said trench groove directly to an isotropic dry etching gas, in the absence of any protection layer in said trench groove, for selectively dry etching said nitride film in lateral directions, thereby forming a trench structure in said substrate, wherein a lateral retreat amount of said nitride film is greater than a thickness of said nitride film.

2. The method of claim 1, further comprising the step of filling an insulating material in said trench groove, thereby forming a trench isolation structure in said substrate.

3. The method as claimed in claim 1, wherein said step (b) is carried out using a resist pattern disposed over said nitride film, and said step (c) is carried out leaving said resist pattern.

* * * * *